United States Patent
Pabon et al.

(10) Patent No.: US 9,890,616 B2
(45) Date of Patent: Feb. 13, 2018

(54) HORIZONTAL WELL DESIGN FOR FIELD WITH NATURALLY FRACTURED RESERVOIR

(71) Applicant: LANDMARK GRAPHICS CORPORATION, Houston, TX (US)

(72) Inventors: Luis A. Pabon, Ciudad del Carmen (MX); Daniel A. Revilla, Ciudad del Carmen (MX); Libertad Sanchez, Ciudad del Carmen (MX)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 15/118,854

(22) PCT Filed: Mar. 12, 2015

(86) PCT No.: PCT/US2015/020176
§ 371 (c)(1),
(2) Date: Aug. 12, 2016

(87) PCT Pub. No.: WO2015/138724
PCT Pub. Date: Sep. 17, 2015

(65) Prior Publication Data
US 2017/0051582 A1 Feb. 23, 2017

Related U.S. Application Data

(60) Provisional application No. 61/951,623, filed on Mar. 12, 2014.

(51) Int. Cl.
G06F 17/50 (2006.01)
E21B 41/00 (2006.01)
E21B 44/00 (2006.01)
G06F 9/455 (2006.01)
E21B 43/26 (2006.01)
E21B 43/30 (2006.01)

(52) U.S. Cl.
CPC .......... *E21B 41/0092* (2013.01); *E21B 43/26* (2013.01); *E21B 43/305* (2013.01); *E21B 44/00* (2013.01); *G06F 9/455* (2013.01); *G06F 17/5009* (2013.01); *G06F 17/50* (2013.01)

(58) Field of Classification Search
USPC ........................................ 703/2, 10; 367/73
See application file for complete search history.

(56) References Cited

U.S. PATENT DOCUMENTS

2007/0193743 A1 8/2007 Harris et al.
2008/0017372 A1 1/2008 Gates et al.
(Continued)

OTHER PUBLICATIONS

PCT Search Report for PCT Application No. PCT/US2015/020176 dated Jun. 22, 2015.
(Continued)

*Primary Examiner* — Thai Phan
(74) *Attorney, Agent, or Firm* — Locke Lord LLP

(57) ABSTRACT

Methods, systems, and computer program products for designing a horizontal well in a hydrocarbon field having naturally fractured reservoir integrates workflows from multiple oilfield related disciplines, including a geophysics workflow, geomechanics workflow, and completion and production workflow to achieve an a dynamic and integrated solution.

10 Claims, 8 Drawing Sheets

(56) References Cited

U.S. PATENT DOCUMENTS

| | | |
|---|---|---|
| 2009/0159277 A1 | 6/2009 | Hocking |
| 2012/0222867 A1 | 9/2012 | Fletcher et al. |
| 2015/0055438 A1* | 2/2015 | Yan .................. G01V 1/282 367/73 |
| 2016/0070024 A1* | 3/2016 | Berard ............... G01V 99/005 703/10 |
| 2016/0108705 A1* | 4/2016 | Maxwell ............ E21B 43/267 166/250.1 |
| 2016/0139588 A1* | 5/2016 | Huang ............... G05B 19/406 700/275 |

OTHER PUBLICATIONS

PCT Written Opinion for PCT Application No. PCT/US2015/020176 dated Jun. 22, 2015.

Liland, Gorm et al. "World's First TAML Level 5 Multi-lateral Well with Individual Remote Inflow Control of Three Branches on Troll Oil Field." OTC Brasil. Offshore Technology Conference, 2013.

Jain, Rachna, et al. "An integrated approach to design completions for horizontal wells for unconventional reservoirs." SPE Journal 18.06 (2013): 1-026.

Das, O. M., et al. "Kuwait Oil Company:"Novel Design and Implementation of Kuwait's First Smart Multilateral Well with Inflow Control Device and Inflow Control Valve for Life-cycle Reservoir Management in High Mobility Reservoir."West Kuwait" SPE 159261.

Ramirez, Julieta Hernandez, et al. "Application of ICD technology for improvement of well's productivity and extension of the oil well's Life in Samaria field." SPE Western Venezuela Section South American Oil and Gas Congress. Society of Petroleum Engineers, 2011.

Carvajal, G. A., et al. "Coupling Reservoir and Well Completion Simulators for Intelligent Multi-Lateral Wells: Part 1." EAGE Annual Conference & Exhibition incorporating SPE Europec. Society of Petroleum Engineers, 2013.

Thornton, K. et al. "Optimization of Inflow Control Device Placement and Mechanical Conformance Decisions Using a New Coupled Well-Intervention Simulator. Paper SPE 139435-MS presented at the SPE Latin-American and Caribbean Petroleum Engineering Conference, Lima, Peru. Dec. 1-3." (2010).

* cited by examiner

HORIZONTAL WELL DESIGN FOR FIELD WITH NATURALLY FRACTURED RESERVOIR

TECHNICAL FIELD

The exemplary embodiments disclosed herein relate generally to methods, systems, and computer program products for designing a horizontal well in a hydrocarbon field having naturally fractured reservoir by integrating workflows from multiple oilfield related disciplines.

BACKGROUND

Drilling horizontal wells, or wells where the lower part of the well bore parallels the hydrocarbon reservoir, is a complicated and costly endeavor for a variety of reasons. The WOB (weight on bit), torque and drag, directional control, and the like, are a few of the factors that need to be managed when drilling horizontal wells.

The difficulties involved in drilling horizontal wells are compounded when the hydrocarbon reservoir is geologically complex due to strong compressive forces. As an example, such compressive forces may create a very fractured and overlapped formation deposit that, when combined with a strong aquifer, can cause early water breakthroughs, rapid decline of oil production rates, and low drilling performance. As a result, multiple scenarios of well surveys and completions are typically analyzed to maximize the life cycle of the well and the hydrocarbon field.

In light of the difficulties that may be encountered in drilling horizontal wells, especially wells involving the type of geological complexities found in many hydrocarbon reservoirs, a need exists for an improved way to design a horizontal well and particularly a way to design a horizontal well for a hydrocarbon field with a naturally fractured reservoir.

BRIEF DESCRIPTION OF THE DRAWINGS

For a more complete understanding of the exemplary disclosed embodiments, and for further advantages thereof, reference is now made to the following description taken in conjunction with the accompanying drawings in which.

DESCRIPTION OF EXEMPLARY EMBODIMENTS

The following discussion is presented to enable a person skilled in the art to make and use the exemplary disclosed embodiments. Various modifications will be readily apparent to those skilled in the art, and the general principles described herein may be applied to embodiments and applications other than those detailed below without departing from the spirit and scope of the disclosed embodiments as defined herein. The disclosed embodiments are not intended to be limited to the particular embodiments shown, but are to be accorded the widest scope consistent with the principles and features disclosed herein.

Figure 1:
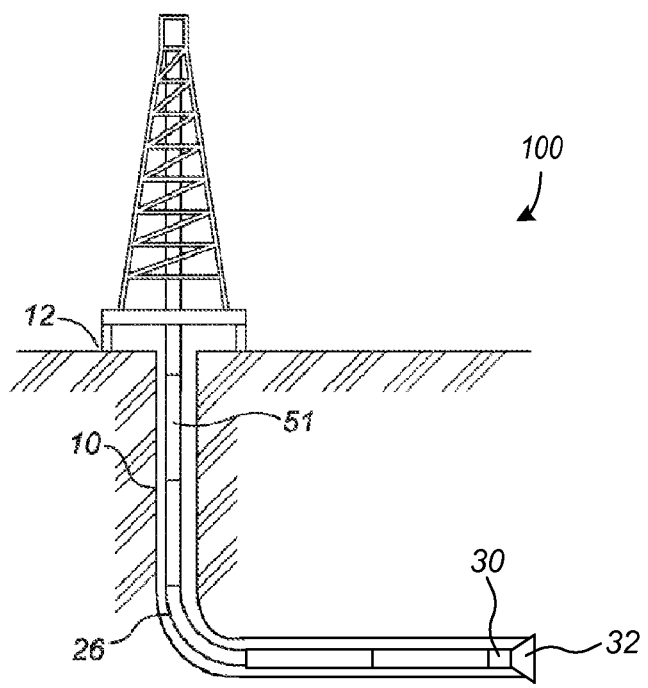
FIG. 1 illustrates a schematic diagram of an oil or gas drilling rig that may be used to drill a horizontal well according to the disclosed embodiments.

Referring now to FIG. 1, an oil drilling rig 100 is shown for implementing certain aspects of the exemplary embodiments disclosed herein. The drilling rig 100 may be used to drill a borehole 10 from a surface location 12, which may be a ground surface, a drilling platform, or any other location outside of the borehole 10 from which drilling may be controlled. The drilling rig 100 has a drill string 26 suspended therefrom composed of a continuous length of pipe known as drilling tubing that is made of relatively short pipe sections 51 connected to one another. The drill string 26 typically has a bottom hole assembly attached at the end thereof that includes a rotary drilling motor 30 connected to a drill bit 32. Drilling is typically performed using sliding drilling where the drill bit 32 is rotated by the drilling motor 30 during drilling, but the drilling tubing is not rotated during drilling. The ability to perform sliding drilling, among other things, allows the trajectory of the drill bit 32 to be controlled to thereby drill in an angled direction relative to vertical, including a horizontal direction.

Drilling a horizontal well, as alluded to above, is a costly and time-consuming process, particularly if the reservoir being drilled has strong compressive forces that can create a fractured and overlapped formation deposit requiring analysis of multiple scenarios of well surveys and completions. The exemplary embodiments disclosed herein relate to an improved method, system, and computer program product for designing a horizontal well in such geologically complex reservoirs. Specifically, the disclosed embodiments employ workflows from multiple oilfield related disciplines to design the horizontal well, including geophysics, geomechanics, and completion and production disciplines. Optimal results may be achieved by applying the exemplary disclosed embodiments before, during, and after the drilling proposal. These exemplary disclosed embodiments may be used in various phases of generating a drilling proposal.

In some embodiments, the workflows may involve conducting a sensitivity analysis to determine whether the reservoir may be more sensitive to one or more particular parameters, such as angle of deviation of the well bore. As well, fluid production and well completion workflows may be designed to prevent early water breakthrough. Methods for prolonging well productive life, increasing incremental oil production, and different options provided by ICD (inflow control device) technology suppliers may also be employed.

As used herein, the term "workflow" generally refers to an orchestrated and repeatable pattern of business and/or engineering activities that are enabled by the systematic organization of resources into one or more processes to transform materials, provide services, and/or process data and information. The term "workflow" is typically understood as a sequence of operations, but may simply be the work of a person or group of persons, an organization, or one or more simple or complex mechanisms.

Among other advantages, the exemplary disclosed embodiments make use of workflows from multiple disciplines to promote multidisciplinary teamwork that integrates geologists, geophysicists, geomechanics, and reservoir, completion, drilling and production engineers, which facilitates achieving an optimal solution for oilfield companies. As well, the exemplary disclosed embodiments make it possible for one PSL (product and service line) to interact very closely with other PSLs, thereby facilitating successful application of recommended product technology, such as inflow control devices, swells packers, and the like. In short, the exemplary disclosed embodiments implement proven standardized collaborative workflows in the disciplines of geosciences, geomechanics, and completion and production to deliver fast results to the well design process. Multidiscipline teamwork, multi-PSL projects, workflow implementation as a strategy, and other aspects are combined to provide innovative and integrated solutions.

Still other advantages include static and dynamic disciplines (e.g., geophysics, geomechanics, completion and production, etc.) being integrated into the well design process using the embodiments disclosed herein. The integration allows the long-term effects of completion components on the reservoir performance and production (e.g., recovery factor, cumulative production, water/gas breakthrough time, etc.) to be investigated. Optimized well survey location may be selected using the maximum curvature attribute, and 3D visualization may be correlated with production history. Areas with higher fracture density may also be determined, and the horizontal length and risky water zones may be defined using the embodiments disclosed herein. Likewise, the rate of penetration (ROP) may be increased and non-productive time (NPT) may be minimized. This approach allows mechanical earth models to identify and focus on solving the more important drilling problems in the hydrocarbon field. For example, a safer mud window may be designed for all stages of the well construction design via the mechanical earth models. Optimized well completion design may be achieved that integrates multiple engineering tools to model the production behavior within the wellbore flow path. And different well types and completions analysis may be performed to optimize productivity and well economics.

Figure 2:
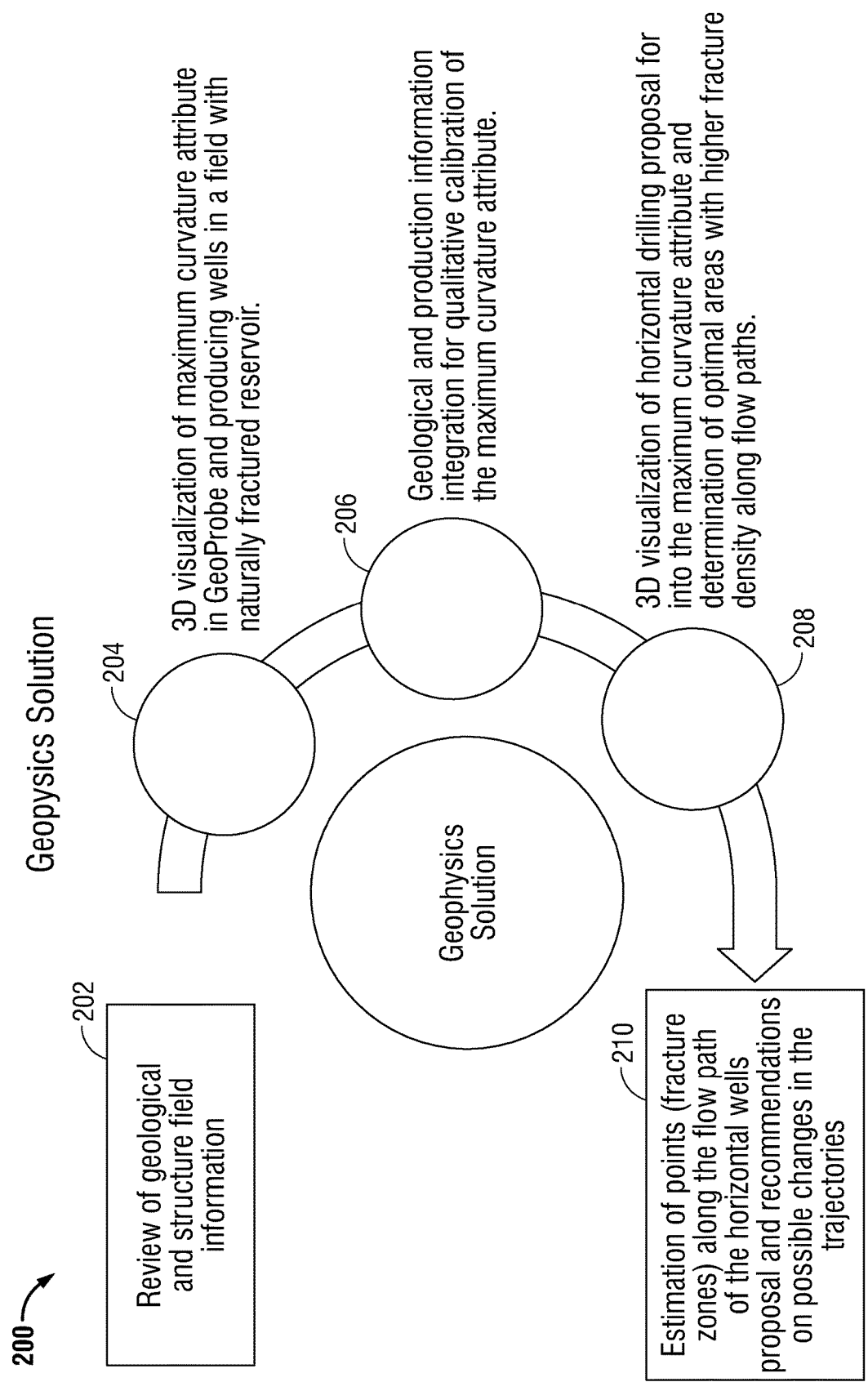
FIG. 2 illustrates a geophysics solution workflow that may be used to design a horizontal well in accordance with the disclosed embodiments.

Turning first to FIG. 2, an exemplary geophysics workflow 200 is shown. This workflow 200 primarily provides 3D visualization and takes advantage of existing functionality in commercially available visualization applications such as OpenWorks GeoProbe from Landmark Graphics Corporation of Houston, Tex. The geophysics workflow 200 entails loading the information provided by the oilfield customer, integrating geological and production information to validate the results, displaying each proposed well, and extracting the attribute of maximum curvature in the well path in order to identify possible locations of large vertical extension fractures observed with seismic volume.

As can be seen in FIG. 2, exemplary phases of the geophysics solution workflow 200 may include: i) an information review phase 202 for reviewing geological and structural field information; ii) a maximum curvature visualization phase 204 for 3D visualization of the maximum curvature attribute for producing wells in a hydrocarbon field with naturally fractured reservoir; iii) an integration phase 206 for integrating geological and production information for qualitative calibration of the maximum curvature attribute; iv) a horizontal drilling visualization phase 208 for 3D visualization of horizontal drilling proposal for the maximum curvature attribute and determination of optimal areas with higher fracture density along flow paths; and v) any fracture zone estimation phase 210 for estimation of points (fracture zones) along the flow path of the horizontal wells, and proposal and recommendations on possible changes in the trajectories.

Several elements of this workflow 200 may be used for optimizing the design of a horizontal well, such as the seismic volume Pre Stack Depth Migration (PSDM), scaled to time to increase continuity and reduce noise. As well, the volume of maximum curvature may be used as a control in the navigation area to the top and the base of the formation of interest (naturally fractured reservoir). Other elements may involve the producing formation underlying the main producing area, including the trajectories of any vertical and deviated wells therein, producers in the carbonate formation thereof, and the paths proposed for horizontal wells.

The various phases 202-210 are well known to those having ordinary skill in the art and therefore a more detailed description is omitted here. The horizontal drilling visualization 208 may include making transparencies of the maximum curvature attribute, leaving only those data points representing maximum discontinuities that are attributable to the fracture zones, combining PSDM seismic volume with the maximum curvature attribute for the completion, analyzing whether, in view of that attribute, discontinuities are reflected in the original seismic volume, and whether the discontinuities correspond to a discontinuity in the seismic signal caused by a formation fracture. Stack sections may be defined along the flow paths in order to analyze the formation fractures in a vertical plane.

With the transparencies of the maximum curvature attribute, sweeps in time (i.e., time slice) and the top of the reservoir (i.e., horizon slice) may be made to verify the input of each production well in the formation, the fracture density, and the intercepts as it moves within the formation. Where the well is a producing well, for each block of the field, an analysis may be performed of the initial rate of production, the decline curve over time, and the water cut in order to compare this initial production and its relationship to the fracturing that is associated with the curvature attribute. From the results of the comparison, a qualitative calibration of the attribute versus productivity of reservoir rock may be obtained.

Subsequently, the same process may be performed for a defined horizontal well in order to observe the interaction of the well with fractured zones and thus to define better the coordinate points (x, y) where fractures are expected along the navigation of carbonate formation. In this way, those fracture zones that could represent a risk for perforation may be identified.

Figure 3:
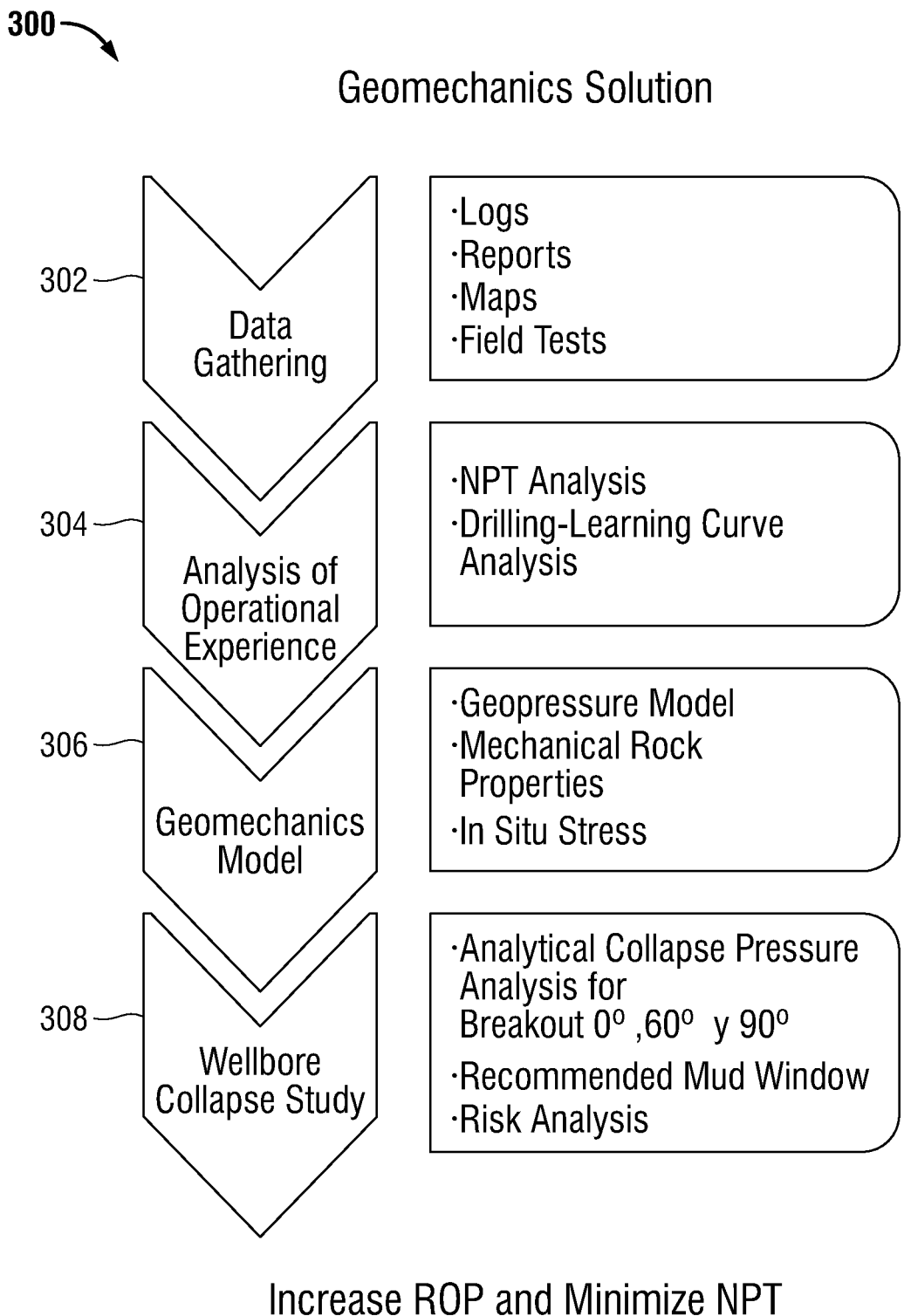
FIG. 3 illustrates a geomechanics solution workflow that may be used to design a horizontal well in accordance with the disclosed embodiments.

FIG. 3 illustrates the geomechanics workflow 300 and exemplary phases thereof, including: i) a data gathering phase 302 for gathering, among other things, well logs, reports, maps, field tests, and the like; ii) an analysis phase 304 for performing analysis of the operational experience, including non-productive time (NPT) analysis, drilling learning curve analysis, and the like; iii) a geomechanics modeling phase 306 for performing geomechanics modeling, including modeling of geopressure, mechanical rock properties, in-situ stress, and the like; and iv) a collapse study phase 308 for performing a wellbore collapse study, including analytical collapse pressure analysis for breakout at 0°, 60°, and 90°. This geomechanics workflow 300 may be used for preparing the 1D geomechanical model and assessing wellbore stability for horizontal wells in fields with naturally fractured reservoirs. The primary objective of this geomechanics workflow 300 is to increase the rate of penetration (ROP) and minimize NPT.

As shown in FIG. 3, the data gathering phase 302 may entail collecting information such as drilling reports, operational graph monitoring, previous geomechanics reports, area maps, well logs, core descriptions, geomechanical laboratory tests, image logs (FMI), field testing (DST or RFT) and the formation tops, surveys of each well and UTM coordinates on the surface. The data was gathered in order to make an inventory of the information that is available for the geomechanical rock model of the area. This allows the analyst to choose the best calibrator wells (more than two wells).

Next, in the analysis phase 304, an analysis of drilling events may be conducted, with a review of drilling wells reports for all wells tested in the area, selected at random to cover most of the study area. This review may generate a database with event information, drilling depths, and mud density used. The events may then be classified based on the stage of construction and geological formation area while drilling the wells in order to detect areas with higher risks of incidences and plot the learning curve of the drilling team.

The quantification of risk of a variable has become one of the great challenges in the oil industry recently, and therefore one of the methods used for assertive decision making when uncertainty of subsurface variables is very high is stochastic analysis, which allows visualization of different scenarios and assigns a degree of reliability or risk. This kind of study helps combine both analytical and probabilistic results in a manner to ensure stability of the wellbore during the drilling process.

In the absence of laboratory tests to calibrate dynamic mechanical properties and elastic modulus, as well as field tests for directly measuring the magnitude of the fracture gradient (FG) and minimum stress (Sh), it may be difficult to estimate with indirect methods the Maximum Stress (SH) of the reservoir. Therefore, in some embodiments, a transcurrent regimen SH>Sv>Sh may be assumed, with K=1.4, using commercially available applications such as Drillworks Predict and Geostress from Landmark Graphics Corporation.

In the geomechanics modeling phase 306, geopressures, rock mechanical properties and in-situ stresses may be combined with the Modified Lade failure criterion to generate a geomechanics model. This model may then be used in the collapse study phase 308 to estimate collapse pressures for a breakout of 0°, 60° and 90°, for example, using Monte Carlo simulation with, for example, 5000 iterations. An assessment of the failure criteria in different depths of the lithological column may be performed and a histogram of frequency of occurrence and the cumulative density function of probability (PDF) may be plotted on each data point. The value of the collapse pressure may be selected to ensure at least a 50% cumulative probability of maintaining a stable well in order to recommend a safer mud window that stays stable throughout the well hole drilling.

Figure 4:
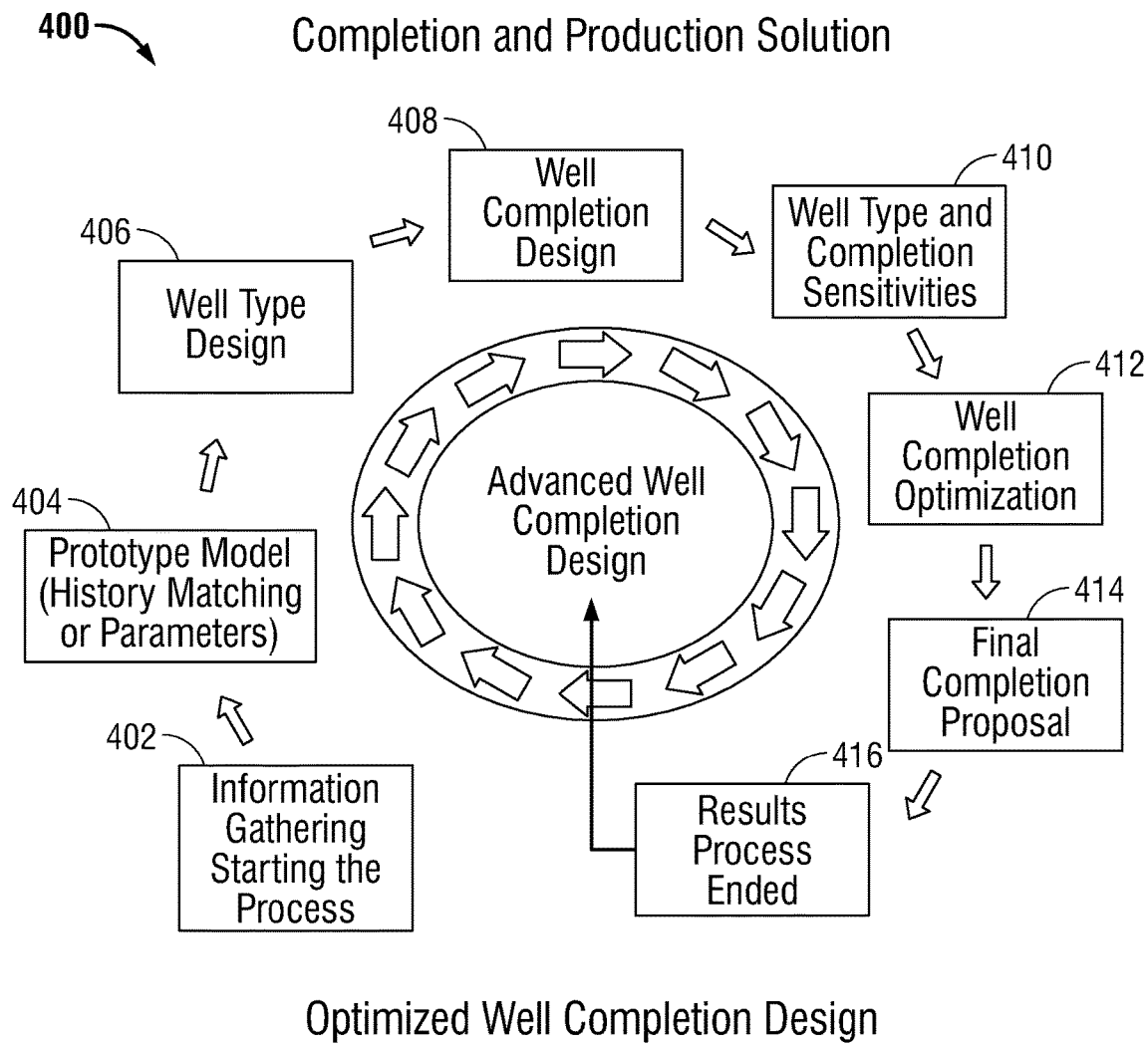
FIG. 4 illustrates a completion and production solution workflow that may be used to design a horizontal well in accordance with the disclosed embodiments.

FIG. 4 illustrates the completion and production workflow 400 and exemplary phases thereof, including: i) an information gathering phase 402; ii) a prototype model development phase 404; iii) a well type design phase 406, iv) a well completion design phase 408; v) a well type and completion sensitivities development phase 410, vi) a well completion optimization phase 412; vii) a final completion proposal generation phase 414; and viii) a results presentation phase 416. The above completion and production workflow 400 may then be used to optimize the well completion design.

To facilitate the optimization process, the workflow 400 may use reservoir simulation tools such as QuikLook and NETool from Halliburton Energy Services, Inc., to quantify benefits and allow completions to be studied over time (i.e., transient analysis). Using these tools, the workflow 400 allows the work teams to focus on evaluating the efficiency of well completion types in order to optimize well performance and maximize oil production, while mitigating production of undesirable fluids (e.g., water and/or gas). The workflow 400 also standardizes and strengthens the processes used by the work teams, including integral methodologies used in projects associated with well productivity in the oil industry.

More specifically, simulation tools such as QuikLook and NETool allow the long-term effects of completion components on the reservoir performance and production to be investigated, including crucial elements such as the recovery factor, cumulative production, and time of water/gas breakthrough. Using these tools, pressures and flow rates may be exchanged for all the time steps for each of the reservoir cells intersected by the well trajectory, resulting in a dynamic and integrated model.

Some of the tasks that may be performed under the completion and production solution workflow 400 include: optimizing the well type and completion design to maximize customer value; evaluating the well type and completion efficiency in terms of cumulative fluids production over time; predicting the effect of the well completion and future behavior of fluids resulting from the settings applied to reservoir and/or complex wells; reducing the financial and operational risk by the use of improved candidate selection; achieving a better understanding of the mechanisms of the reservoir; reducing the cycle time of decision; and investigating the optimal placement of isolating zones over time.

Where QuikLook and NETool are used to implement the workflow 400, the following exemplary procedure may be performed to achieve the best results, it being understood that modifications and additions may be made to the procedure without departing from the scope of the exemplary disclosed embodiments: create a model in QuikLook and NETool of a base case; run simulation integrating QuikLook and NETool for the base case; save files and database results of base case; create a model in QuikLook and NETool of the case with different devices to the base case or current completion; run simulation integrating QuikLook and NETool for the case with different devices to the base case or current completion; save files and database of obtain results of case with different devices to the base case or current completion; create a model in QuikLook and NETool of the case with optimized devices; run simulation integrating QuikLook and NETool for the case with optimized devices; save database of the output results of the case with optimized device; and perform a data post process, compare and show results.

Figure 5:
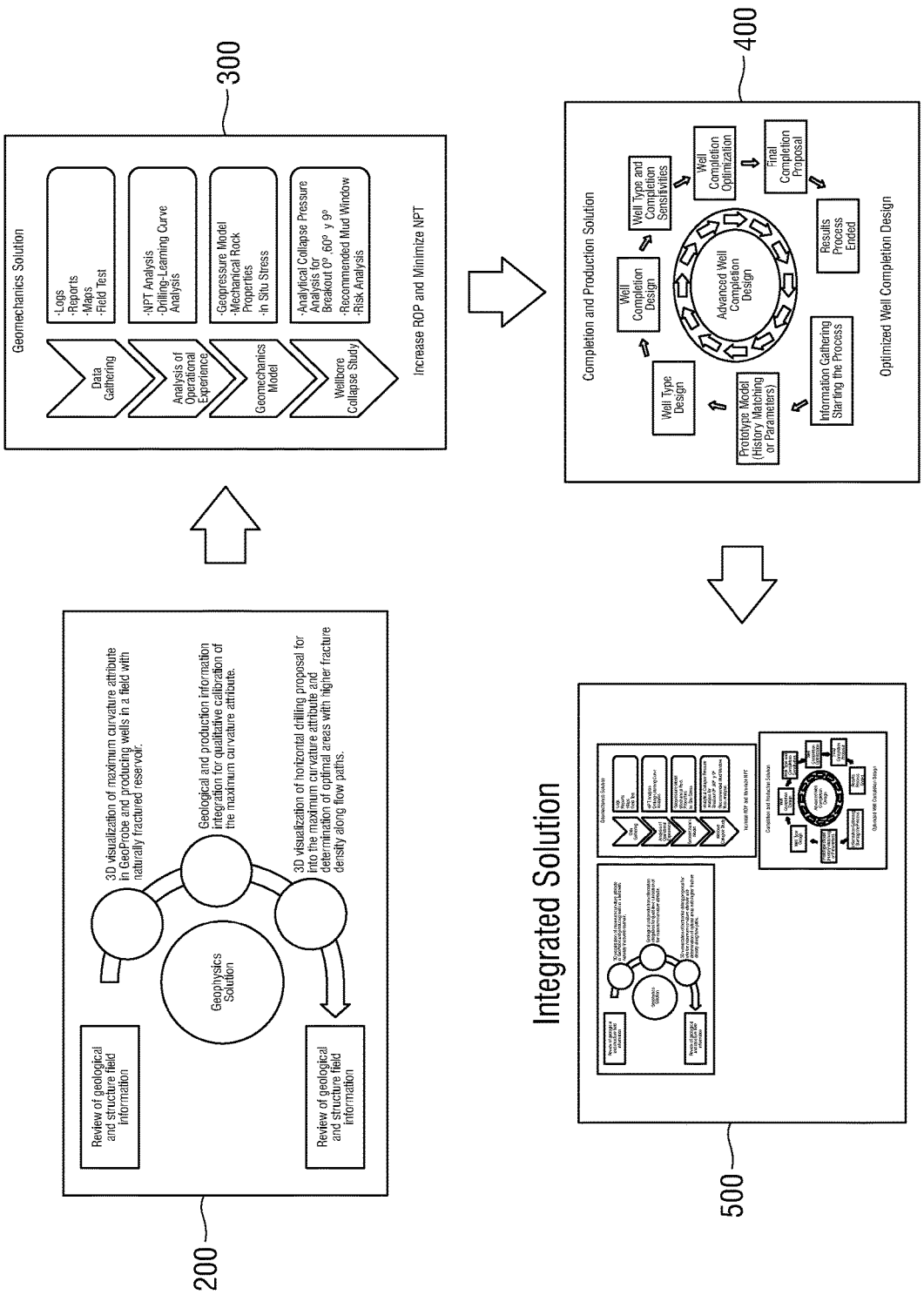
FIG. 5 illustrates an integrated workflow for a horizontal well design in fields with a naturally fractured reservoir in accordance with the disclosed embodiments.

FIG. 5 illustrates the foregoing multiple disciplinary workflows 200, 300, and 400 being combined to provide a unique and integrated solution 500 for designing a horizontal well in fields having naturally fractured reservoirs. The integration beneficially implements standardized and collaborative workflows involving the geosciences, geomechanics, and completion and production processes that deliver rapid and effective results. These innovative and integrated workflows 200, 300, and 400 optimize the well design and completion process, allow effective evaluation of efficiencies, enable prediction of the effect on future reservoir performance, help delay water breakthrough, and improve well production.

In some embodiments, the benefits from each workflow 200, 300, and 400 may be optimized for the well survey location using the maximum curvature attribute in 3D and correlated with production history. This may be done in order to determine the area with higher fracture density, define the horizontal length, and isolate risky water zones. In addition, increased ROP and minimized NPT may be achieved, primarily using analysis of operational experience together with a mechanical earth model. This allows the focus to be placed on the biggest problems in drilling the field, resulting in a safer mud window for all stages of well construction design. Also, well completion design may be optimized by integrating suitable software simulation packages to model production behavior within the wellbore flow path with the support and expertise of product and service line advisors.

Figure 6:
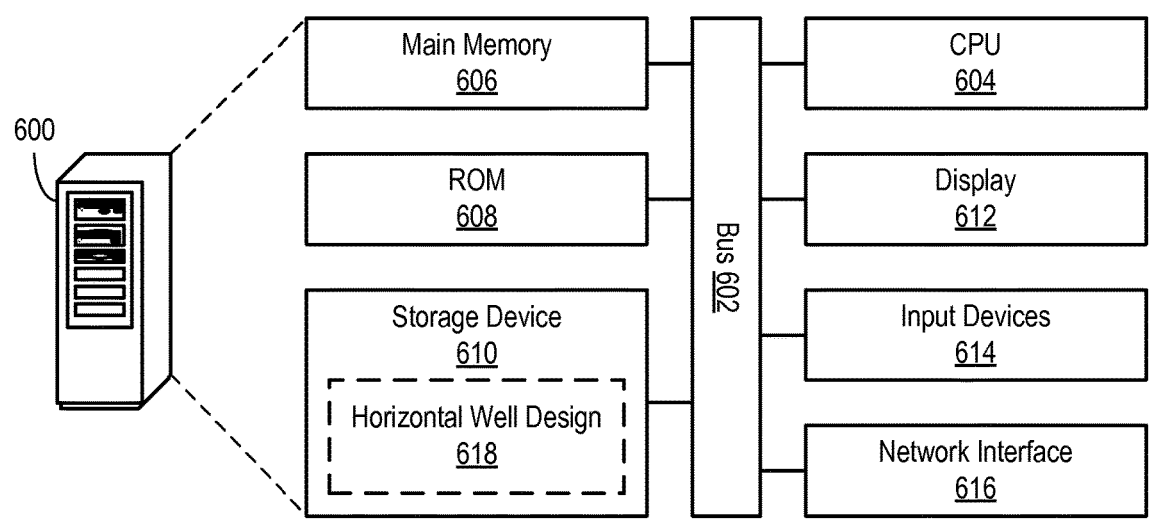
FIG. 6 illustrates computing system that may be used to design a horizontal well in accordance with the disclosed embodiments.

FIG. 6 illustrates an exemplary system 600 that may be used to perform the multi-workflow horizontal well design process described herein. The exemplary system 600 may be a conventional workstation, desktop, or laptop computer, or it may be a custom computing system 600 developed for a particular application. In a typical arrangement, the horizontal well design system 600 includes a bus 602 or other communication pathway for transferring information among other components within the system 600, and a CPU 604 coupled with the bus 602 for processing the information. The system 600 may also include a main memory 606, such as a random access memory (RAM) or other dynamic storage device coupled to the bus 602 for storing computer-readable instructions to be executed by the CPU 604. The main memory 606 may also be used for storing temporary variables or other intermediate information during execution of the instructions by the CPU 604.

The horizontal well design system 600 may further include a read-only memory (ROM) 608 or other static storage device coupled to the bus 602 for storing static information and instructions for the CPU 604. A computer-readable storage device 610, such as a nonvolatile memory (e.g., Flash memory) drive or magnetic disk, may be coupled to the bus 602 for storing information and instructions for the CPU 604. The CPU 604 may also be coupled via the bus 602 to a display 612 for displaying information to a user. One or more input devices 614, including alphanumeric and other keyboards, mouse, trackball, cursor direction keys, and so forth, may be coupled to the bus 602 for communicating information and command selections to the CPU 604. A communications interface 616 may be provided for allowing the horizontal well design system 600 to communicate with an external system or network.

The term "computer-readable instructions" as used above refers to any instructions that may be performed by the CPU 604 and/or other components. Similarly, the term "computer-readable medium" refers to any storage medium that may be used to store the computer-readable instructions. Such a medium may take many forms, including, but not limited to, non-volatile media, volatile media, and transmission media. Non-volatile media may include, for example, optical or magnetic disks, such as the storage device 610. Volatile media may include dynamic memory, such as main memory 606. Transmission media may include coaxial cables, copper wire and fiber optics, including wires of the bus 602. Transmission itself may take the form of electromagnetic, acoustic or light waves, such as those generated during radio frequency (RF) and infrared (IR) data communications. Common forms of computer-readable media may include, for example, magnetic medium, optical medium, memory chip, and any other medium from which a computer can read.

In accordance with the exemplary disclosed embodiments, one or more horizontal well design applications 618, or the computer-readable instructions therefor, may also reside on or be downloaded to the storage device 610 for execution. In general, the one or more horizontal well design applications 618 are or include one or more computer programs that may be executed by the CPU 604 and/or other components to allow users to design a horizontal well. Such horizontal well design applications 618 may be implemented in any suitable computer programming language or software development package known to those having ordinary skill in the art, including various versions of C, C++, FORTRAN, and the like.

Figure 7:
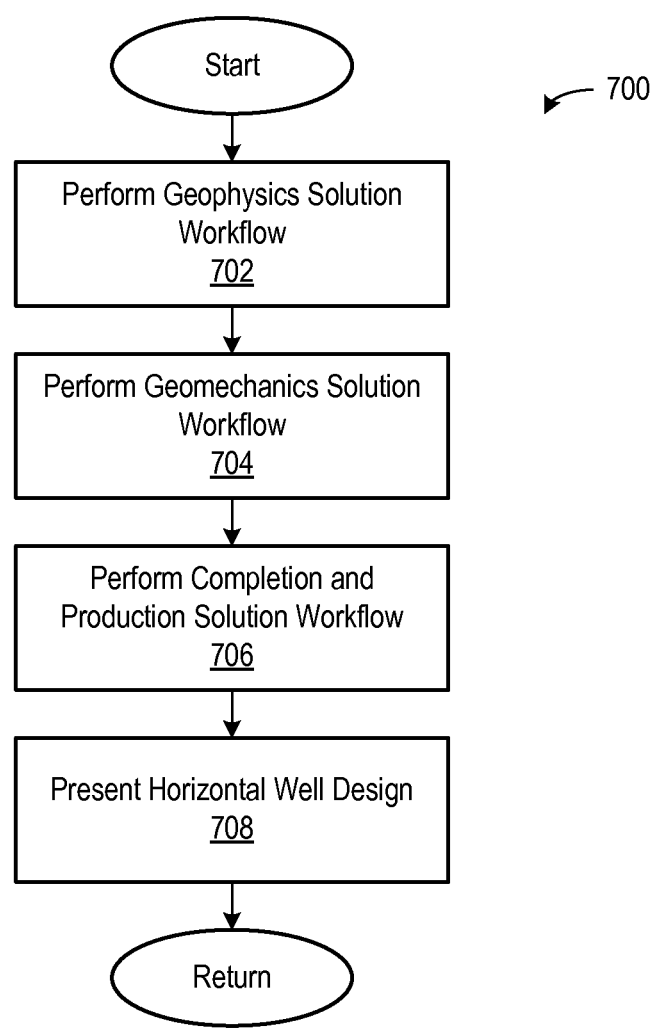
FIG. 7 illustrates a process that may be used to design a horizontal well in accordance with the disclosed embodiments.

FIG. 7 illustrates a method 700 that may be used by, or in conjunction with, one or more of the horizontal well design applications 618. It should be noted that although FIG. 7 (and other figures herein) show a number of discrete blocks, those having ordinary skill in the art will understand that any one of these blocks may be divided into two or more constituent blocks and/or two or more of these blocks may be combined to form a single block as needed without departing from the scope of the disclosed embodiments. In addition, the method 700 may be performed entirely automatically by the one or more horizontal well design applications 618, or parts of the method 700 may be performed automatically and parts of the methodology 700 may be performed manually as needed.

As can be seen, the method 700 begins at block 702, where the geophysics solution workflow is performed as substantially described herein (see FIG. 2) by or using an appropriate one or more of the horizontal well design applications 618, including some or all of the various phases 202-210 discussed above. At block 704, the geomechanics solution workflow is performed as substantially described herein (see FIG. 3) by or using an appropriate one or more of the horizontal well design applications 618, including some or all of the various phases 302-308 discussed above. At block 706, the completion and production solution workflow is performed as substantially described herein (see FIG. 4) by or using an appropriate one or more of the horizontal well design applications 618, including some or all of the various phases 402-416 discussed above. Finally, the results of the various workflows are presented at block 708 by or using an appropriate one of the horizontal well design applications 618.

Figure 8:
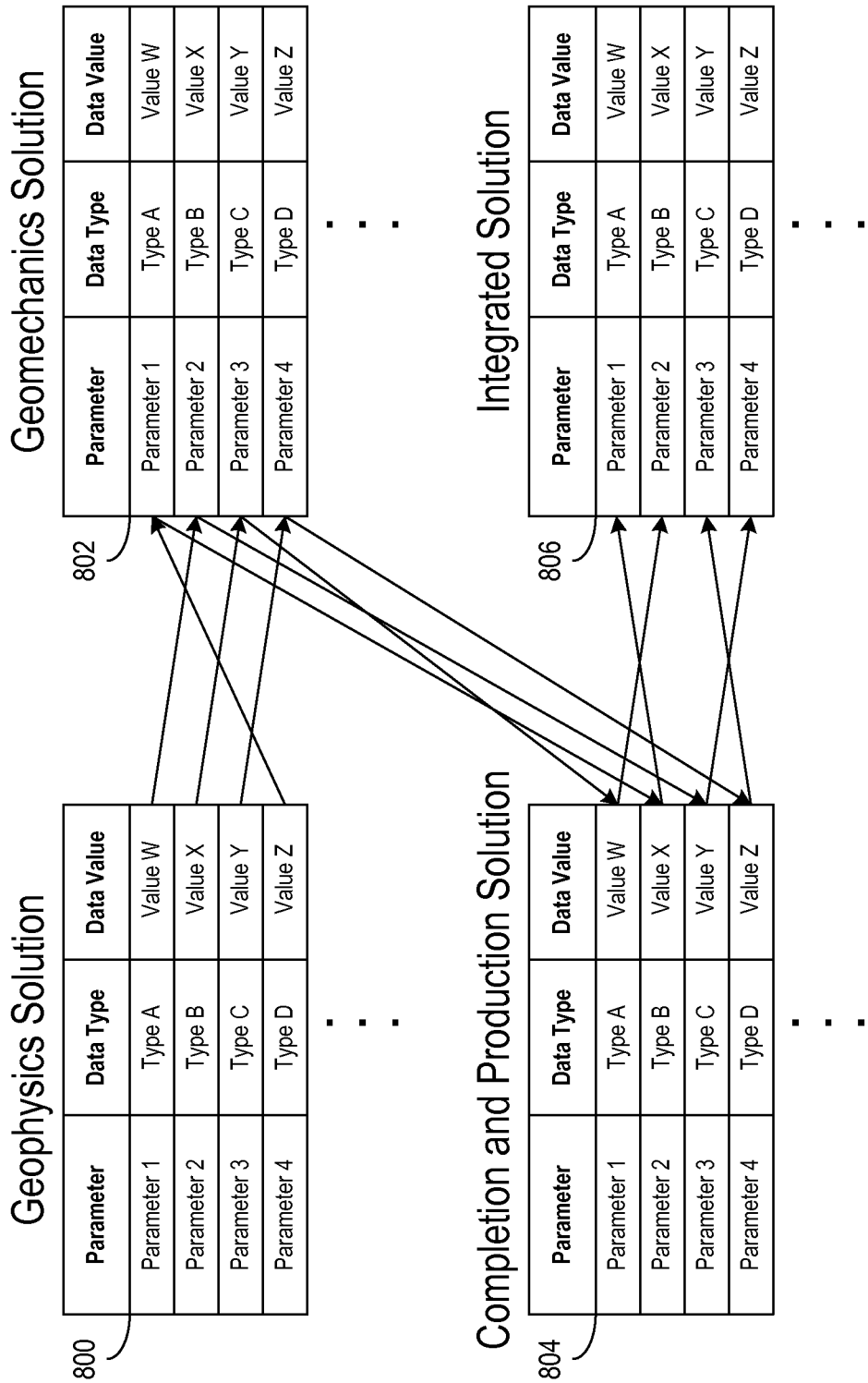
FIG. 8 illustrates a database representation of integrated workflow for a horizontal well design in fields with a naturally fractured reservoir in accordance with the disclosed embodiments.

FIG. 8 depicts the integration of the workflows 200, 300, and 400 discussed herein in more detail as performed by or using an appropriate one or more of the horizontal well design applications 618. As mentioned above, the integration may be performed entirely automatically or portions of the integration may be performed automatically and portions of the integration may be performed manually. In the example shown here, data and information resulting from or used by a given workflow may be stored in a database for that respective workflow. Thus, for example, data and information resulting from or used by the geophysics workflow 200 are stored in a geophysics database 800, data and information resulting from or used by the geomechanics workflow 300 are stored in a geomechanics database 802, data and information resulting from or used by the completion and production workflow 400 are stored in a completion and production database 804, and data and information resulting from or used by the integrated solution 500 are stored in integrated database 806.

In accordance with the disclosed embodiments, data and information resulting from or used by the geophysics workflow 200 may also be stored and used in the geomechanics workflow 300, as indicated by arrows mapping such data and information from the geophysics database 800 to the geomechanics database 802. As well, data and information resulting from or used by the geomechanics workflow 300 may also be stored and used in the completion and production workflow 400, as indicated by arrows mapping such data and information from the geomechanics database 802 to the completion and production database 804. Likewise, data and information resulting from or used by the completion and production workflow 400 may also be stored and used in the integrated solution 500, as indicated by arrows mapping such data and information from the completion and production database 804 to the integrated database 806.

In some embodiments, one or more integration rules may be established and applied to the integration of the data and information resulting from or used by the various workflows. As one simplistic example, if the maximum curvature attribute derived from the geophysics workflow 200 satisfies or fails to satisfy a predetermined criterion, then a certain action is performed or omitted, respectively, or performed in a modified way in the geomechanics workflow 300. As another simplistic example, if the NPT analysis from the geomechanics workflow 300 satisfies or fails to satisfy a predetermined criterion, then a certain action is performed or omitted, respectively, or performed in a modified way in the completion and production workflow 400. One or more of the integration rules along with the data and information affected these rules by may be stored in a rules table, an example of which is reproduced below in Table 1.

TABLE 1

INTEGRATION RULES

| From.Workflow.Parameter | To.Workflow.Parameter | Integration Rule |
|---|---|---|
| Geophysics.Parameter1 | Geomechanics.Parameter2 | Rule A |
| Geomechanics.Parameter3 | CompletionProduction.Parameter1 | Rule B |
| Geomechanics.Parameter2 | CompletionProduction.Parameter4 | Rule C |
| ... | ... | ... |

Thus, as set forth above, the embodiments disclosed herein may be implemented in a number of ways. For example, in general, in one aspect, the disclosed embodiments relate to a computer-based system for designing a horizontal oil well. The system comprises a central processing unit mounted within the computer-based system, a display electrically connected to the central processing unit, and a storage device in data communication with the central processing unit. The storage device stores one or more applications thereon for integrating a plurality of workflows to design a horizontal well in a hydrocarbon field with a naturally fractured hydrocarbon reservoir. The workflows comprise a geophysics workflow, a geomechanics workflow, and a completion and production workflow.

In general, in another aspect, the disclosed embodiments relate to a computer-based method for designing a horizontal oil well. The method comprises integrating a plurality of workflows using a central processing unit to design a horizontal well in a hydrocarbon field with a naturally fractured hydrocarbon reservoir. The integration comprises performing a geophysics workflow using the central processing unit, performing a geomechanics workflow using the central processing unit, and performing a completion and production workflow using the central processing unit.

In general, in yet another aspect, the disclosed embodiments relate to a computer-readable medium storing computer-readable instructions thereon. The computer-readable instructions include instructions for causing a computer to integrate the results of a plurality of workflows in a design a horizontal well in a hydrocarbon field with a naturally fractured hydrocarbon reservoir, including instructions for causing the computer to perform a geophysics workflow, perform a geomechanics workflow, and perform a completion and production workflow.

In some embodiments, the geophysics workflow may comprise a review of geological and structural field information, 3D visualization of maximum curvature attribute for producing wells in a hydrocarbon field with naturally fractured reservoir, geological and production information integration for qualitative calibration of the maximum curvature attribute, 3D visualization of horizontal drilling proposal for the maximum curvature attribute and determination of optimal areas with higher fracture density along flow paths, and estimation of points (fracture zones) along the flow path of the horizontal wells, and proposal and recommendations on possible changes in the trajectories.

In some embodiments, the geomechanics workflow may comprise data gathering, including gathering of logs, reports, maps, and field tests; analysis of operational experience, including non-productive time (NPT) analysis and drilling learning curve analysis; geomechanics modeling, including modeling of geopressure, mechanical rock properties, and in-situ stress; and wellbore collapse study, including analytical collapse pressure analysis for breakout at 0°, 60°, and 90°.

In some embodiments, the completion and production workflow may comprise information gathering, developing prototype model, developing a well type design, developing a well completion design, developing well type and completion sensitivities, performing well completion optimization, and generating final completion proposal.

While the invention has been described with reference to one or more particular embodiments, those skilled in the art will recognize that many changes may be made thereto without departing from the spirit and scope of the description. Each of these embodiments and obvious variations thereof is contemplated as falling within the spirit and scope of the claimed invention, which is set forth in the following claims.

What is claimed is:

1. A computer-based system for designing a horizontal oil well, comprising:
    a central processing unit mounted within the computer-based system;
    a display electrically connected to the central processing unit; and
    a storage device in data communication with the central processing unit, the storage device storing one or more applications thereon for integrating a plurality of workflows to design a horizontal well in a hydrocarbon field with a naturally fractured hydrocarbon reservoir, the workflows comprising a geophysics workflow, a geomechanics workflow, and a completion and production workflow;
    the storage device further storing one or more integration rules for integrating the plurality of workflows, each integration rule causing the central processing unit to perform or omit a predefined action, respectively, in a given one of the workflows if a design parameter derived from a different one of the workflows satisfies or fails to satisfy a predetermined criterion.

2. The computer-based system of claim 1, wherein the geophysics workflow comprises:
- a review of geological and structural field information;
- 3D visualization of maximum curvature attribute for producing wells in a hydrocarbon field with naturally fractured reservoir;
- geological and production information integration for qualitative calibration of the maximum curvature attribute;
- 3D visualization of horizontal drilling proposal for the maximum curvature attribute and determination of optimal areas with higher fracture density along flow paths; and
- estimation of points (fracture zones) along the flow path of the horizontal wells, and proposal and recommendations on possible changes in the trajectories.

3. The computer-based system of claim 1, wherein the geomechanics workflow comprises:
- data gathering, including gathering of logs, reports, maps, and field tests;
- analysis of operational experience, including non-productive time (NPT) analysis and drilling learning curve analysis;
- geomechanics modeling, including modeling of geopressure, mechanical rock properties, and in-situ stress; and
- wellbore collapse study, including analytical collapse pressure analysis for breakout at 0°, 60°, and 90°.

4. The computer-based system of claim 1, wherein the completion and production workflow comprises:
- information gathering;
- developing prototype model;
- developing a well type design;
- developing a well completion design;
- developing well type and completion sensitivities;
- performing well completion optimization; and
- generating final completion proposal.

5. A computer-based method for designing a horizontal oil well, comprising:
- integrating a plurality of workflows using a central processing unit to design a horizontal well in a hydrocarbon field with a naturally fractured hydrocarbon reservoir, such integrating comprising:
  - performing a geophysics workflow using the central processing unit;
  - performing a geomechanics workflow using the central processing unit; and
  - performing a completion and production workflow using the central processing unit; and
- performing or omitting a predefined action, respectively, in a given one of the workflows using the central processing unit if a design parameter derived from a different one of the workflows satisfies or fails to satisfy a predetermined criterion.

6. The computer-based method of claim 5, wherein the geophysics workflow comprises:
- a review of geological and structural field information;
- 3D visualization of maximum curvature attribute for producing wells in a hydrocarbon field with naturally fractured reservoir;
- geological and production information integration for qualitative calibration of the maximum curvature attribute;
- 3D visualization of horizontal drilling proposal for the maximum curvature attribute and determination of optimal areas with higher fracture density along flow paths; and
- estimation of points (fracture zones) along the flow path of the horizontal wells, and proposal and recommendations on possible changes in the trajectories.

7. The computer-based method of claim 5, wherein the geomechanics workflow comprises:
- data gathering, including gathering of logs, reports, maps, and field tests;
- analysis of operational experience, including non-productive time (NPT) analysis and drilling learning curve analysis;
- geomechanics modeling, including modeling of geopressure, mechanical rock properties, and in-situ stress; and
- wellbore collapse study, including analytical collapse pressure analysis for breakout at 0°, 60°, and 90°.

8. The computer-based method of claim 5, wherein the completion and production workflow comprises:
- information gathering;
- developing prototype model;
- developing a well type design;
- developing a well completion design;
- developing well type and completion sensitivities;
- performing well completion optimization; and
- generating final completion proposal.

9. The computer-based system of claim 1, wherein the storage device stores a plurality of design parameters for each one of the workflows in a database, each design parameter having a data type and a data value associated therewith, and wherein the database maps at least one design parameter for the geophysics workflow to at least one design parameter for the geomechanics workflow, at least one design parameter for the geomechanics workflow to at least one design parameter for the completion and production workflow, and at least one design parameter for the completion and production workflow to at least one design parameter for an integrated solution for designing the horizontal oil well.

10. The computer-based method of claim 5, wherein integrating further comprises using a storage device to store a plurality of design parameters for each one of the workflows in a database, each design parameter having a data type and a data value associated therewith, and wherein the database maps at least one design parameter for the geophysics workflow to at least one design parameter for the geomechanics workflow, at least one design parameter for the geomechanics workflow to at least one design parameter for the completion and production workflow, and at least one design parameter for the completion and production workflow to at least one design parameter for an integrated solution for designing the horizontal oil well.

* * * * *